(12) United States Patent
Erdos et al.

(10) Patent No.: US 8,692,572 B2
(45) Date of Patent: Apr. 8, 2014

(54) METHOD OF DETECTING A FAULT IN A PERMANENT-MAGNET ALTERNATOR AND POWER SUPPLY DEVICE COMPRISING A DETECTOR MODULE

(75) Inventors: Virginie Erdos, Paris (FR); Thanh-Tuan Truong, Paris (FR); Mehdi Dallagi, Paris (FR)

(73) Assignee: Sagem Defense Securite, Paris (FR)

( * ) Notice: Subject to any disclaimer, the term of this patent is extended or adjusted under 35 U.S.C. 154(b) by 0 days.

(21) Appl. No.: 13/809,842

(22) PCT Filed: Jul. 18, 2011

(86) PCT No.: PCT/EP2011/062250
§ 371 (c)(1),
(2), (4) Date: Mar. 18, 2013

(87) PCT Pub. No.: WO2012/010557
PCT Pub. Date: Jan. 26, 2012

(65) Prior Publication Data
US 2013/0187678 A1      Jul. 25, 2013

(30) Foreign Application Priority Data
Jul. 19, 2010   (FR) .................... 10 55871

(51) Int. Cl.
*G01R 31/34* (2006.01)

(52) U.S. Cl.
USPC .......... 324/765.01; 324/764.01; 324/76.52; 324/76.68

(58) Field of Classification Search
USPC ............. 324/764.01, 76.52, 76.77, 86, 107, 324/765.01
See application file for complete search history.

(56) References Cited

U.S. PATENT DOCUMENTS

| 5,506,743 | A | * | 4/1996 | Phillips | 361/85 |
| 5,565,753 | A | * | 10/1996 | Chen et al. | 318/809 |
| 5,757,596 | A | * | 5/1998 | Weber et al. | 361/23 |
| 7,342,386 | B2 | * | 3/2008 | Wildash | 323/272 |
| 2003/0071591 | A1 | * | 4/2003 | Ta et al. | 318/434 |
| 2007/0013387 | A1 | * | 1/2007 | Smith et al. | 324/546 |
| 2009/0121668 | A1 | | 5/2009 | West et al. | |

* cited by examiner

*Primary Examiner* — Patrick J Assouad
*Assistant Examiner* — Alexander J Nemtzow
(74) *Attorney, Agent, or Firm* — Muncy, Geissler, Olds & Lowe, P.C.

(57) ABSTRACT

A method of detecting a failure of an alternator supplying three-phase electricity to a load, the method comprising the steps of determining a duty ratio for each of the phases at the output of the alternator, determining phase differences between the phases at the output of the alternator; and determining the presence of a failure as a function of the phase differences and as a function of a comparison of the duty ratios. A power supply device is also provided for implementing the method.

7 Claims, 3 Drawing Sheets

Fig.2

| Condition / Type of failure | Diff AB=120°, Diff BC=120°, Diff AC=240° | DRA=0%, DRB=DRC, Diff BC=60° | DRA=0%, DRB=DRC, Diff BC=180° | DRB=0%, DRA=DRC, Diff CA=60° | DRB=0%, DRA=DRC, Diff AC=Diff CA=180° | DRC=0%, DRA=DRB, Diff AB=60° | DRC=0%, DRA=DRB, Diff AB=180° | DRA=DRB=DRC, Diff AB=0° | DRA=DRB=DRC, Diff AC=0° |
|---|---|---|---|---|---|---|---|---|---|
| No failure | X | | | | | | | | |
| PhaseA_sc_ground (internal) | | | | | | | | | |
| PhaseA_sc_neutral (external) | | X | | | | | | | |
| PhaseA&B_sc | | | | | | | | | |
| PhaseA&C_sc | | | X | | | | | | |
| PhaseA_oc | | | | | | | | | |
| PhaseB_sc_ground (internal) | | | | | | | | | |
| PhaseB_sc_neutral (external) | | | | X | | | | | |
| PhaseB&C_sc | | | | | | | | | |
| PhaseB_oc | | | | | | | | | |
| PhaseC_sc_ground (internal) | | | | | | | | | |
| PhaseC_sc_neutral (external) | | | | | | X | | | |
| PhaseC_oc | | | | | | | X | | |
| PhaseA&B_sc_neutral (external) | | | | | | | | | |
| PhaseA&B_oc | | | | | | | | | |
| PhaseA&C_sc_neutral (external) | | | | | | | | X | |
| PhaseA&C_oc | | | | | | | | | |
| PhaseA&C_sc_ground (internal) | | | | | | | | | |
| PhaseB&C_sc_ground (internal) | | | | | | | | | |
| PhaseB&C_oc | | | | | | | | | |
| PhaseB&C_sc_neutral (external) | | | | | | | | | X |
| All faulty | | | | | | | | | |

Fig.2 cont.

| Condition / Type of failure | DRA=DRB=DRC, DiffBC=0° | DRB=DRC, DRA<DRB | DRA=DRC, DRB<DRC | DRA=DRB, DRC<DRA | DRA=DRB=0%, DRC!=0% | DRA=DRC=0%, DRB!=0% | DRC=DRB=0%, DRA!=0% | DRC=DRB=DRA=0% |
|---|---|---|---|---|---|---|---|---|
| No failure | | | | | | | | |
| PhaseA_sc_ground (internal) | | | | | | | | |
| PhaseA_sc_neutral (external) | | X | | | | | | |
| PhaseA&B_sc | | | | | | | | |
| PhaseA&C_sc | | | | | | | | |
| PhaseA_oc | | | | | | | | |
| PhaseB_sc_ground (internal) | | | | | | | | |
| PhaseB_sc_neutral (external) | X | | | | | | | |
| PhaseB&C_sc | | | | | | | | |
| PhaseB_oc | | | | | | | | |
| PhaseC_sc_ground (internal) | | | | | | | | |
| PhaseC_sc_neutral (external) | | | X | | | | | |
| PhaseC_oc | | | | X | | | | |
| PhaseA&B_sc_ground (internal) | | | | | | | | |
| PhaseA&B_oc | | | | | | | | |
| PhaseA&B_sc_neutral (external) | | | | | X | | | X |
| PhaseA&C_sc_ground (internal) | | | | | | | | |
| PhaseA&C_sc_neutral (external) | | | | | | X | | X |
| PhaseA&C_oc | | | | | | | | |
| PhaseB&C_sc_ground (internal) | | | | | | | X | X |
| PhaseB&C_sc_neutral (external) | X | | | | | | | X |
| PhaseB&C_oc | | | | | | | | |
| All faulty | | | | | | | | X |

METHOD OF DETECTING A FAULT IN A PERMANENT-MAGNET ALTERNATOR AND POWER SUPPLY DEVICE COMPRISING A DETECTOR MODULE

FIELD OF THE INVENTION

The present invention relates to a method of detecting a failure of an alternator.

The invention is applicable to various types of alternator, and in particular to permanent magnet alternators (PMAs), with or without neutral.

BACKGROUND OF THE INVENTION

In airplanes, there are computers that are powered by a three-phase alternator that is driven by the engine of the airplane.

The alternator is connected to the computer by a power supply device performing control of the pulse width modulation (PWM) type.

The device has a control stage and a power stage. The control stage receives a setpoint signal and supplies the power stage with a control signal that is modulated with a predetermined duty ratio. The power stage is connected firstly to the alternator via a filter and a rectifier, and secondly to the remainder of the computer to which the power stage supplies a voltage that corresponds to the control signal. For this purpose, and by way of example, the power stage includes at least one chopper transistor controlled by the control signal. A regulation loop is provided to guarantee the performance required by the computer (in terms of accuracy and response time).

In this application, where failure of a computer could have consequences that are considered as being critical, one of the main preoccupations is that of detecting failures, and preferably of identifying faulty components.

It is thus known to detect a failure on the basis of a voltage measurement performed on each phase of the alternator, with a zero voltage on one particular phase revealing a failure of that phase, for example. It is also possible to reveal seven types of failure (three types of individual failure, three types of simultaneous failure in two phases, and one type of failure that applies to all three phases simultaneously). This does indeed make it possible to detect the faulty phase, but it does not make it possible to identify the type of failure, i.e. a phase being short circuited to ground, a short circuit between phases, or an open circuit in a phase.

OBJECT AND SUMMARY OF THE INVENTION

An object of the invention is to provide simple means making it possible to detect and identify failures while an alternator is powering a load.

To this end, the invention provides a method of detecting a failure of an alternator supplying three-phase electricity to a load, the method comprising the steps of:

determining a duty ratio for each of the phases at the output of the alternator;

determining phase differences between the phases at the output of the alternator; and determining that a failure is present as a function of the phase differences and as a function of comparing the duty ratios.

Failure detection is performed by using duty ratio, which is a magnitude representative of balance between the phases of the alternator. The value of the duty ratio on each phase and a comparison of duty ratios between phases, in association with the phase differences between phases, makes it possible to identify a faulty phase and to identify the type of failure: i.e. open circuit or short circuit between phases or relative to ground or neutral.

Advantageously, the voltage at the output from the alternator is transformed into a squarewave signal before determining duty ratio and phase differences.

The squarewave signal is configured to conserve duty ratio and phase, and it makes subsequent processing for extracting duty ratio and phase easier than with a sinewave signal.

Preferably, the voltage at the output of the alternator is filtered before determining duty ratio and phase differences.

The voltage depends on the speed of rotation of the alternator, such that the voltage at low speeds of rotation is unusable by the load and is eliminated by the filtering.

The invention also provides a power supply device comprising a control stage, a power stage, and a failure detector module arranged to implement the method of the invention.

BRIEF DESCRIPTION OF THE DRAWINGS

Other characteristics and advantages of the invention appear on reading the following description of a particular and non-limiting implementation of the invention.

Reference is made to the accompanying drawings, in which:

FIG. 2 is a table showing various types of failure.

MORE DETAILED DESCRIPTION

Figure 1:
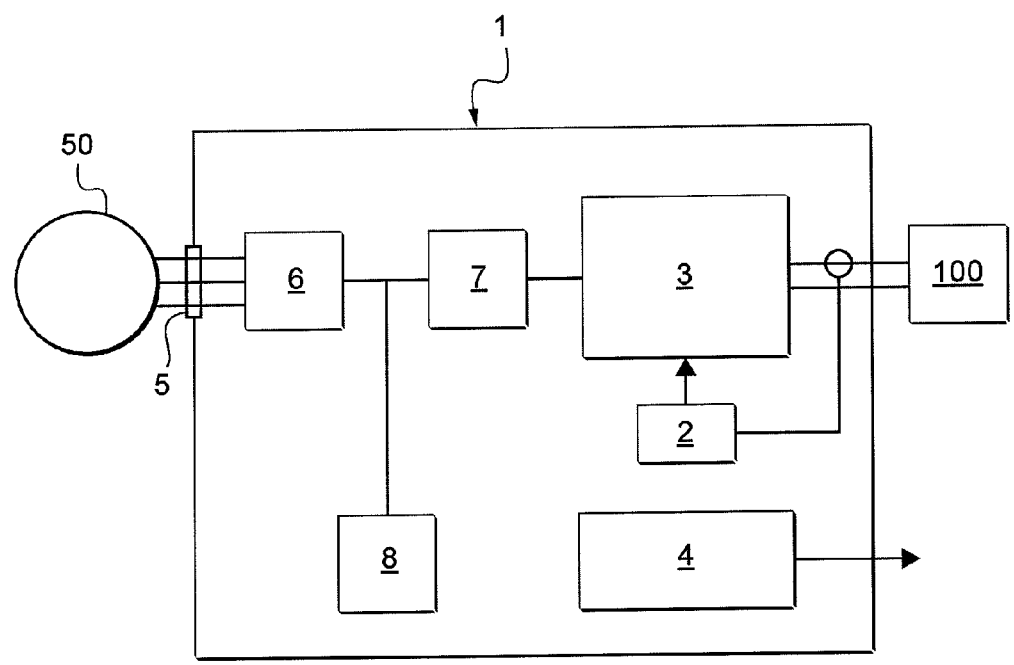
FIG. 1 is a diagram of a power supply device in accordance with the invention.

With reference to the figures, the invention relates to a power supply device, given overall reference 1, that is for connecting an alternator 50 to a load 100 in order to power the load.

The alternator 50 is arranged to deliver three-phase electricity at a voltage that is a function of the speed of rotation of the alternator.

By way of example, the load 100 is a computer of the kind found on board airplanes for ensuring proper operation of mechanical members of an airplane, e.g. the engines.

The power supply device, given overall reference 1, comprises a control stage 2, a power stage 3, and a failure detector module 4. The power stage 3 has an input connected to means 5 providing a connection to the alternator 50 via a filter 6 and a rectifier 7.

The control stage 2 is arranged in known manner to deliver the power stage 3 with a control signal that is modulated with a predetermined pulse width ratio as a function of a setpoint signal (the control signal is of the pulse width modulation (PWM) type).

In known manner, the power stage 3 comprises transistors, each having a control input receiving a control signal for controlling it to take up its ON state and its OFF state as a function of the duty ratio. Electricity flowing through the transistors is forwarded to the load 100.

The detector module is connected to the output of the filter 6 via a conditioning unit 8 that is arranged to transform the sinewave signal output by the filter into a squarewave signal having the same duty ratio and the same phase as the original signal.

The detector module 4 is arranged to implement a failure detection method.

The method comprises the steps of:
- determining the duty ratio of each of the phases at the output of the alternator;
- determining the phase differences between the phases at the output of the alternator; and
- determining that a failure is present as a function of the phase differences, of the value of the duty ratio on each phase, and of a comparison of the duty ratios between phases.

This makes it possible to detect alternator failures and the corresponding information is sent to the cockpit by the detector module 4.

In a nominal mode of operation, the phase difference between the phases A and B or DiffAB is equal to the phase difference between the phases B and C, or DiffBC, and is 120°, while the phase difference between the phases A and C, or DiffAC, is 240°.

The table of FIG. 2 summarizes various types of failure.

The types of failure of the phase A are listed below.

Short circuiting phase A with neutral, or an external short circuit written PhaseA_sc_neutral is revealed when the duty ratio of the phase B, or DRB, is equal to the duty ratio of the phase C, or DRC, while the duty ratio of the phase A, or DRA is less than DRB.

A short circuit between the phase A and ground, or an internal short circuit written PhaseA_sc_ground is revealed when DRA is 0% while DRB is equal to DRC and DiffBC is equal to 60°.

A short circuit between phases A and B, written PhaseA&B_sc is revealed when the three duty ratios are equal and DiffAB is zero.

A short circuit between the phases A and C, written PhaseA&C_sc is revealed when the three duty ratios are equal and DiffAC is zero.

An open circuit of phase A, written PhaseA_OC, is revealed when DRA is equal to 0%, DRB is equal to DRC and DiffBC is 180°.

A short circuit of phases A and B with ground, written PhaseAB_sc_ground is revealed when DRA is equal to DRB and DRC is equal to 0%.

A short circuit of phases A and B with neutral, written PhaseAB_sc_neutral, is revealed when the three duty ratios are equal and DiffAB is zero.

An open circuit of phases A and B, written PhaseAB_OC, is revealed when the three duty ratios are equal to 0%.

A short circuit of phases A and C with ground, written PhaseAC_sc_ground is revealed when DRA=DRC and DRB=0%.

A short circuit of phases A and C with neutral, written PhaseAC_sc_neutral is revealed when the three duty ratios are equal and DiffAC is zero.

An open circuit of phases A and C, written PhaseAC_OC is revealed when the three duty ratios are equal to 0%.

A defect in all of the phases also gives rise to all three duty ratios being equal to 0%.

It is easy to deduce other types of failure affecting the phases B and C respectively.

Naturally, the invention is not limited to the embodiments described, but covers any variant coming within the ambit of the invention as defined by the claims.

In particular, the power supply device may have a structure that is different from that described so long as said structure enables the method of the invention to be implemented.

What is claimed is:

1. A method of detecting a failure of an alternator supplying three-phase electricity to a load, wherein the method comprises the steps of:
- determining a duty ratio of the phases at the output of the alternator on each of its phases;
- determining phase differences between the phases at the output of the alternator; and
- determining that a failure of the alternator is present as a function of the phase differences and as a function of comparing the duty ratios.

2. The method according to claim 1, wherein the voltage at the output from the alternator is transformed into a squarewave signal before determining duty ratio and phase differences.

3. The method according to claim 1, wherein the voltage at the output of the alternator is filtered before determining duty ratio and phase differences.

4. A power supply device, comprising:
a means for connection connected to a three-phase alternator, a control stage, a power stage, and a failure detector module arranged to implement the following steps:
- determining a duty ratio of the phases at the output of the alternator on each of its phases;
- determining phase differences between the phases at the output of the alternator; and
- determining that a failure of the alternator is present as a function of the phase differences and as a function of comparing the duty ratios.

5. The device according to claim 4, wherein a filter and a rectifier are mounted between the means for connection to the three phase alternator and the power stage, the detector module being connected to receive the voltage after filtering but before said voltage is rectified.

6. The device according to claim 4, wherein the detector module includes a conditioning unit at its input that is arranged to transform the voltage into a squarewave signal.

7. A method of detecting a failure of an alternator supplying three-phase electricity to a load, wherein the method comprises the steps of:
- determining a duty ratio of the phases at the output of the alternator on each of its phases;
- determining phase differences between the phases at the output of the alternator; and
- determining that a failure of the alternator is present and identify the type of failure as a function of the phase differences and as a function of comparing the duty ratios.

* * * * *